United States Patent
Rose

(10) Patent No.: US 8,847,235 B2
(45) Date of Patent: Sep. 30, 2014

(54) CASCODED SEMICONDUCTOR DEVICES

(71) Applicant: NXP B.V., Eindhoven (NL)

(72) Inventor: Matthias Rose, Helmond (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/937,451

(22) Filed: Jul. 9, 2013

(65) Prior Publication Data

US 2014/0027785 A1    Jan. 30, 2014

(30) Foreign Application Priority Data

Jul. 30, 2012  (EP) .................................. 12178518

(51) Int. Cl.
| | |
|---|---|
| *H01L 29/15* | (2006.01) |
| *H03K 17/0812* | (2006.01) |
| *H03K 17/10* | (2006.01) |
| *H03K 17/567* | (2006.01) |
| *H01L 27/06* | (2006.01) |

(52) U.S. Cl.
CPC .......... *H01L 27/06* (2013.01); *H03K 17/08122* (2013.01); *H03K 17/102* (2013.01); *H03K 17/567* (2013.01)
USPC ............................................. 257/76; 257/77

(58) Field of Classification Search
CPC .... H01L 27/06; H03K 17/0812; H03K 17/10; H03K 17/567
USPC ...................................................... 257/76, 77
See application file for complete search history.

(56) References Cited

U.S. PATENT DOCUMENTS

| | | | |
|---|---|---|---|
| 5,184,199 A * | 2/1993 | Fujii et al. ........................ 257/77 |
| 8,487,667 B2 * | 7/2013 | Iwamura ........................ 327/109 |
| 2001/0024138 A1 | 9/2001 | Dohnke et al. | |
| 2002/0153938 A1 | 10/2002 | Baudelot et al. | |
| 2004/0027753 A1 * | 2/2004 | Friedrichs et al. .............. 361/90 |
| 2008/0185642 A1 * | 8/2008 | Montgomery ................ 257/330 |
| 2010/0117095 A1 | 5/2010 | Zhang | |
| 2011/0199148 A1 | 8/2011 | Iwamura | |
| 2011/0254018 A1 | 10/2011 | Domes et al. | |
| 2012/0262220 A1 * | 10/2012 | Springett ....................... 327/430 |
| 2013/0320354 A1 * | 12/2013 | Treu et al. ........................ 257/76 |

FOREIGN PATENT DOCUMENTS

| | | |
|---|---|---|
| DE | 10 2006 029 928 B3 | 9/2007 |
| DE | 10 2010 027 832 B3 | 7/2011 |
| DE | 10 2011 083 684 B3 | 7/2012 |

OTHER PUBLICATIONS

Domes, D. et al "Cascode Light—Normally-on JFET Stand Alone Performance in a Normally-Off Cascode Circuit", Paper 49, PCIM Europe conf., 5 pgs. (May 6, 2010).

Domes, D. et al "1st Industrialized 1200V SiC JFET Module for High Energy Efficiency Applications", Paper 94, PCIM Europe conf., 6 pgs. (May 2011).

Extended European Search Report for European Patent Appln. No. 12178518.2 (Dec. 17, 2012).

\* cited by examiner

*Primary Examiner* — Trung Q Dang

(57) ABSTRACT

A cascoded power semiconductor circuit is provided for power switches based on depletion-mode (normally on) devices. The control circuit makes use of a bootstrap arrangement that allows an active control of both power switches of a cascode circuit using a single gate driver.

19 Claims, 2 Drawing Sheets

CASCODED SEMICONDUCTOR DEVICES

CROSS-REFERENCE TO RELATED APPLICATIONS

This application claims the priority under 35 U.S.C. §119 of European patent application no. 12178518.2, filed on Jul. 30, 2012, the contents of which are incorporated by reference herein.

This invention relates to cascoded semiconductor devices. It relates in particular to depletion mode transistors, such as gallium nitride (GaN) transistors (e.g. GaN high electron mobility transistors (HEMTs)), or silicon carbide (SiC) MOSFETs.

The invention is of particular interest for GaN power transistors. Basic GaN power semiconductors are depletion mode (normally-on) devices. Attempts to introduce additional layers in the layer stack of the power semiconductor to make the device normally-off come together with device performance penalties. Therefore, cascoding high-voltage GaN switches with conventional low-voltage silicon MOSFETs is a viable option to combine the advantages of Silicon and GaN power devices.

Another advantage of a cascoded switch is the fact that existing standard gate drivers can be used as the device DC characteristics are mainly defined by the silicon MOSFET. Therefore the device can be used as a direct replacement for silicon MOSFETs or IGBTs.

FIG. 1 shows a well-known approach of a series connection of a normally-on gallium nitride transistor ($M_{GaN}$) and a normally-off silicon MOSFET transistor ($M_{Si}$) power switch in a cascode configuration. This approach is becoming more and more popular for power electronic applications as new GaN power semiconductors with superior device characteristics compared to Silicon based switches are emerging.

In the standard cascode configuration of FIG. 1, only the power MOSFET $M_{Si}$ is controlled actively by a gate driver, which generates the gate signal $V_{GM}$. The GaN switch $M_{GaN}$ is controlled indirectly via the silicon MOSFET $M_{Si}$ as the MOSFET drain-to-source voltage is connected to equal the GaN source-to-gate voltage.

Cascoded switches have disadvantages that hamper their use in power conversion applications. These disadvantages relate to:

dynamic avalanche which gives rise to reliability issues of the low voltage silicon MOSFET during turn-off;

barely adjustable switching speed (both dv/dt and di/dt);

increased output capacitance $C_{OSS}$ compared to a single normally-on switch;

no device reverse operation if diode-gate GaN switches are used;

risk of gate isolation breakdown due to high source-gate voltages when an insulated gate GaN (MIS) transistor is used.

According to the invention, there is provided a cascode transistor circuit comprising:

a gallium nitride field effect transistor or a silicon carbide insulated gate field effect transistor having its drain connected to a high power rail;

a silicon MOSFET with its drain connected to the source of the gallium nitride or silicon carbide FET and its source connected to a low power rail;

a bootstrap capacitor connected between the gates of the gallium nitride or silicon carbide FET and the silicon MOSFET; and a diode with its anode connected to the gate of the gallium nitride or silicon carbide FET and its source connected to the low power rail.

The invention provides a control circuit which makes use of a bootstrap arrangement to allow an active control of both power switches of a cascode circuit using a single gate driver, since the gates are connected by the bootstrap circuit (capacitor and diode). The diode is used to charge the capacitor when the cascode (silicon) MOSFET is turned on and blocks the voltage to generate a negative voltage at the gate of the gallium nitride or silicon carbide FET when the device turns off.

The diode can comprise a discrete Schottky or pn-junction diode connected outside the package of the cascode structure. Alternatively, the diode can be integrated either on the GaN or SiC FET chip or the Si chip of the cascode transistor. In this case bond wires are used to establish the necessary interconnects between the Si chip and the GaN or SiC FET chip.

In one preferred implementation a Schottky diode is integrated on the GaN or SiC FET chip. For example, GaN technology is a lateral device technology which allows integration of additional circuitry. The diode needs to be designed only for the average gate current of the GaN or SiC FET. It is therefore a small diode structure in comparison to the GaN or SiC FET.

The GaN or SiC FET preferably comprises a high voltage power semiconductor, such as a GaN high electron mobility transistor (HEMT). GaN transistors are considered to be most attractive for operating voltages in the range of 200V up to 1200V. GaN transistors can generally be used for a very broad range of applications and power levels. For example, they can be used in high performance, high frequency power supplies in which high efficiency and power density is achieved at a premium.

The silicon MOSFET transistor preferably comprises a low voltage power MOSFET (typically $V_{Ds}<30V$) in a trench MOS technology. The MOSFET is scaled in relation to the GaN or SiC FET and can have an on-state resistance ($R_{Ds(on)}$) which is a small fraction of the on-state resistance of the GaN or SiC transistor.

The bootstrap capacitor preferably comprises a discrete capacitor next to the cascode switch device. It can be a low voltage rated capacitor as it will be charged to the driver supply voltage. The capacitance is preferably at least the same size as the input capacitance ($C_{ISS}$) of the GaN or SiC FET, or more preferably several times larger.

The invention also provides a circuit arrangement comprising:

a cascode transistor circuit of the invention; and a gate driver circuit with a single gate signal output.

The cascode transistor circuit enables standard gate drivers to be used.

An example of the invention will now be described in detail with reference to the accompanying drawings, in which.

The invention provides a cascoded power semiconductor circuit. Emerging new power switches based on GaN and SiC insulated gate devices (such as MOSFETs) often have depletion-mode (normally on) behaviour. Hence, they cannot be used in most power converter applications because they are turned on if the gate is unbiased and hence cause undesired fault conditions in the application. One common solution to realize an inherently safe power switch is to combine a conventional enhancement-mode (normally-off) power switch with these depletion mode (normally-on) power switches in a cascode configuration. The invention provides a circuit which makes use of a bootstrap arrangement to allow an active control of both power switches of a cascode circuit using a single gate driver.

Figure 2:
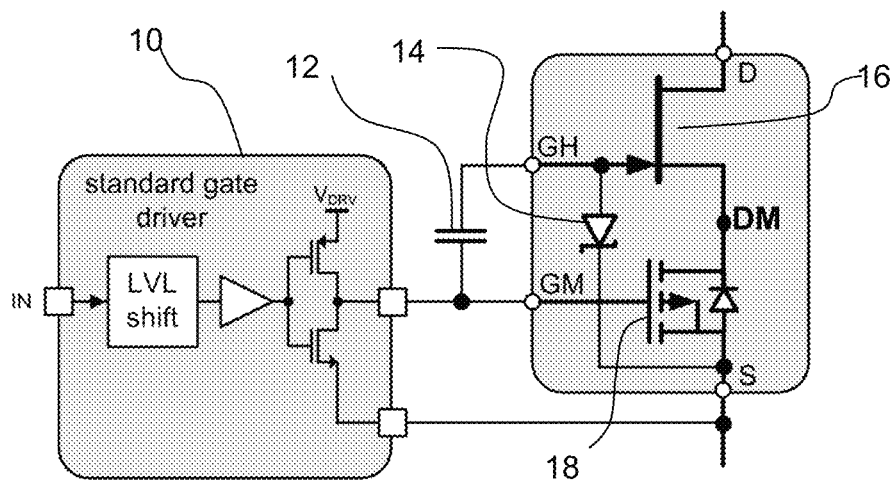
FIG. 2 shows a cascode circuit of the invention.

A bootstrap controlled cascode circuit comprising an example of the invention is shown in FIG. 2.

Figure 1:
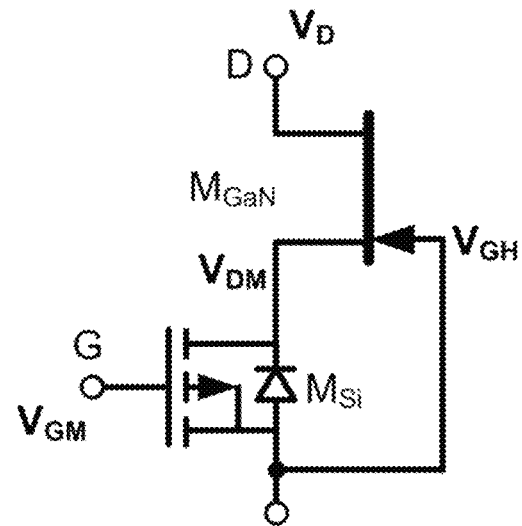
FIG. 1 shows a known cascode circuit.

It comprises a standard gate driver 10 with a single gate output, a bootstrap circuit 12, 14, a cascode connected normally on transistor 16 (corresponding to $M_{GaN}$ in FIG. 1) and a normally off transistor 18 (corresponding to $M_{Si}$ in FIG. 1). In the description below, the normally on transistor is described as a GaN HEMT.

The cascode circuit comprises the two transistors in series (i.e. with their drain-source channels in series) between power lines. The cascode circuit has external connections to the gate of the normally on transistor 16 (node GH) and to the gate of the normally off transistor 18 (node GM).

The bootstrap circuit comprises a capacitor 12 between the gate driver circuit output and the gate of the transistor 16, so that this capacitor is between the gates of the two transistors, and a bootstrap diode 14 between the gate of the transistor 16 and the source of the transistor 18.

The bootstrap diode 14 can in practice be integrated with the circuit of the GaN transistor in which case only one additional bootstrap capacitor is required outside the cascode circuit package. The cascode circuit package is shown as a grey area in FIG. 2. It is a dual die solution with a Si chip (the silicon MOSFET 18) and a GaN chip (GaN transistor 16 and diode 14). In the example shown, the diode is a separate device integrated on the same chip as the GaN transistor (and therefore in the grey area), but it can be a discrete component outside the cascode switch package.

In the example shown, the normally off transistor is a silicon MOSFET, and the gate driver is a conventional MOSFET gate driver. The normally on transistor is a GaN HEMT transistor. As mentioned above, it can instead be a SiC MOSFET.

While the silicon MOSFET 18 is turned on, the bootstrap capacitor 12 will be charged by the gate driver to the MOSFET on-state voltage.

When turning off the MOSFET 18, the node voltages of GM and GH will change in the same manner as a result of the bootstrap capacitor. The node between the series connection of the transistors is shown as DM (the drain of the MOSFET).

At the beginning of turn off, the voltage at GM equals the MOSFET on state voltage and the voltage at GH is about zero. While turning off the MOSFET 18, the GM node voltage will decrease and node GH will become negative. Both devices are controlled by the gate driver simultaneously.

Considering typical threshold voltage values for the GaN transistor 16 and the MOSFET device 18, the GaN device will turn off first and takes the full drain source voltage. During the increase of the overall drain voltage the MOSFET is still turned on and discharges the node DM before it becomes a floating node.

The use of this circuit gives several advantages compared to the known standard cascode circuit, which will be described in the following section.

As outlined above, the circuit aims to address one or more of the problems of known cascode circuits, namely:
 dynamic avalanche problems;
 limited adjustment to the switching speed;
 increased output capacitance;
 no device reverse operation if diode gate GaN/SiC switches are used
 risk of gate isolation breakdown due to high source-gate voltages when a GaN/SiC MIS transistor is used.

Dynamic Avalanche

To turn off a cascoded switch as shown in FIG. 1, the MOSFET $M_{Si}$ is controlled by a gate driver. When the gate voltage of $M_{Si}$ reaches the threshold voltage level $V_t$, $M_{Si}$ stops conducting current while $M_{GaN}$ is still turned on.

At this moment the drain voltage at node DM starts increasing. As mentioned before, the $M_{Si}$ drain-source voltage equals the $M_{GaN}$ source-gate voltage. Hence, an increase of $V_{DM}$ implies a decrease of $M_{GaN}$ gate-source voltage as well. The GaN/SiC device turns off passively when its source-gate voltage equals its $V_t$. If the cascode is considered to be ideal, the $M_{Si}$ drain-source voltage would then be limited to the threshold voltage $V_t$ of $M_{GaN}$.

For real device considerations two factors lead to an increased $M_{Si}$ drain-source voltage:

The passive turn off of $M_{GaN}$ is delayed due to parasitic gate inductances (leads and bond wires) and gate resistances (gate metallization) forming a delay with the $M_{GaN}$ device input capacitance $C_{ISS}$.

When $M_{GaN}$ reaches pinch off, the node DM becomes a floating node. The voltage is further increased as $M_{GaN}$ and $M_{Si}$ output capacitances $C_{OSS}$ form a capacitive voltage divider.

Figure 3:
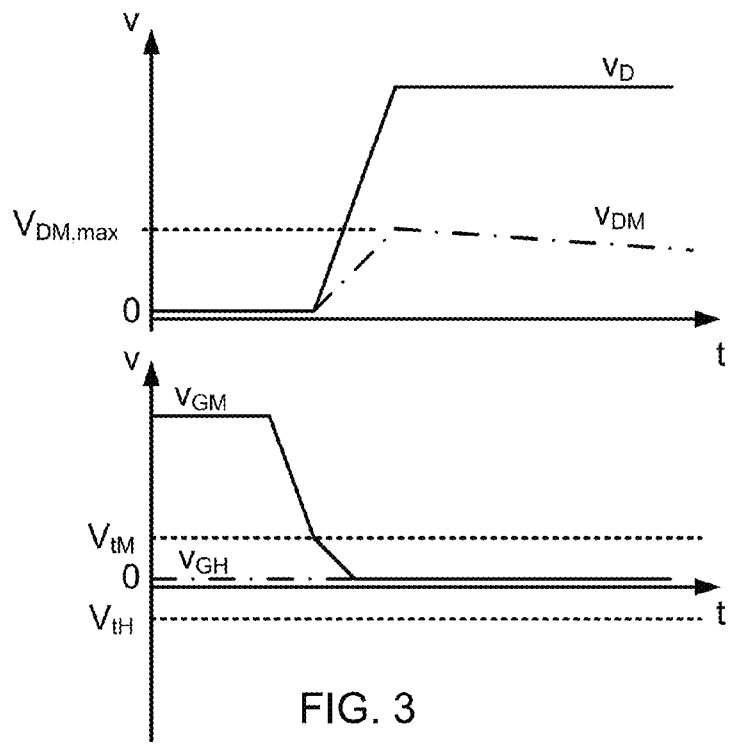
FIG. 3 shows waveforms relating to the operation of the circuit of FIG. 1.

FIG. 3 shows the turn off behavior of the standard cascode circuit of FIG. 1.

The plots shown are the gate signal $V_{GM}$ for the silicon MOSFET, the gate signal $V_{GH}$ for the GaN transistor, the GaN drain signal $V_D$ (the high power rail) and the MOSFET drain signal $V_{Dm}$ which equates to the drain-source voltage across the MOSFET. These are all shown in FIG. 1. In addition, the threshold voltages for the silicon MOSFET and for the GaN transistor are shown as $V_{tM}$ and $V_{tH}$. The plots show the switch off characteristics.

The drain-source voltage $V_{Dm}$ across the MOSFET $M_{Si}$ reaches about 10%-20% of the overall drain-source voltage $V_D$ of the cascode. While the $M_{GaN}$ threshold voltage is low (e.g. $V_{tH}$=−2V), the MOSFET $M_{Si}$ drain voltage peak at node DM can be significantly higher (e.g. $V_{Dm}$=60V). This behavior leads either to dynamic avalanche of $M_{Si}$ or to the use of higher breakdown voltage rated MOSFETs which decreases device performance.

Figure 4:
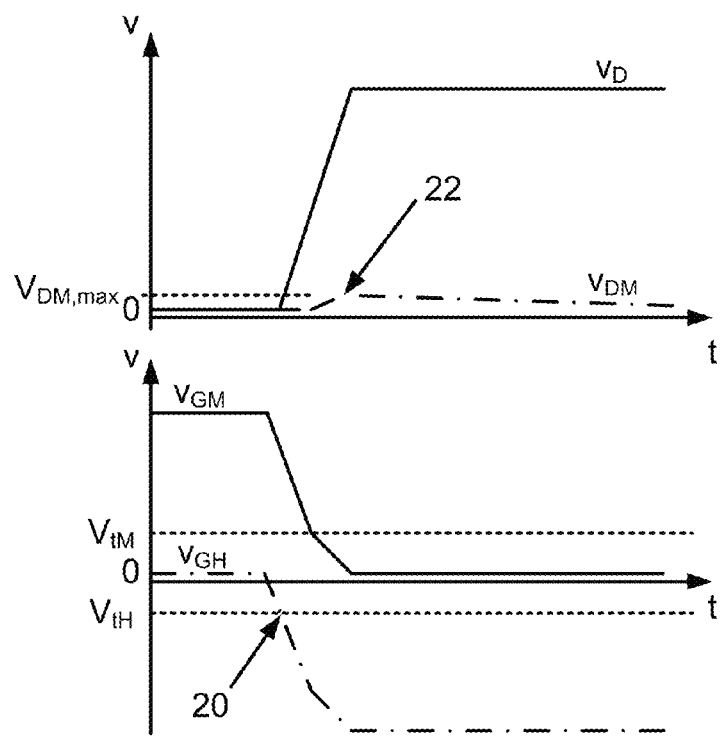
FIG. 4 shows waveforms relating to the operation of the circuit of FIG. 2.

FIG. 4 shows the behavior of the bootstrap controlled cascode according to the circuit shown in FIG. 2.

The plots shown are the MOSFET gate signal $V_{GM}$, the GaN gate signal $V_{GH}$, the MOSFET drain signal $V_{DM}$ which equates to the drain-source voltage across the MOSFET and the GaN drain signal $V_D$ (the high power rail). These are all shown in FIG. 2. The threshold voltages for the silicon MOSFET and for the GaN transistor are again shown as $V_{tM}$ and $V_{tH}$. The plots again show the switch off characteristics.

The voltage at node GH becomes negative at the time shown as 20 and the GaN device turns off first. By switching with the driver circuit of FIG. 2, the MOSFET drain voltage peak (node DM) can be reduced to negligible levels without the risk of dynamic avalanche of MOSFET $M_{Si}$. Thus, as shown at 22, the MOSFET drain voltage does not increase significantly during turn off.

The diode 14 is thus used to charge the capacitor 12 when the cascode MOSFET is turned on and blocks the voltage to generate a negative voltage at the gate of the GaN transistor when the device turns off.

Switch Controllability

The bootstrap controlled cascode offers better controllability of switching speed (by means of dv/dt and di/dt during switching) compared to the standard cascode. In case of a standard cascode the input capacitance of switch $M_{GaN}$ (see FIG. 1) is charged by the drain current during turn off and discharged via the switch $M_{Si}$ during turn on. Hence, no direct control of $M_{GaN}$ is possible via the driver. In case of the bootstrap cascode the driver charges and discharges the gates of both switches $M_{GaN}$ and $M_{Si}$ simultaneously.

Because the two switches turn on and off at different voltage levels and therefore at different moments during a switching transition, the switching speed of $M_{GaN}$ can be adjusted directly by the driver.

Increased Output Capacitance

As described above, the switch $M_{GaN}$ turns on and off passively in the case of a standard cascode. Hence, the input capacitance of $M_{GaN}$ is charged and discharged by the device output rather than by a gate driver connected to the input. This leads to an increased effective output capacitance $C_{OSS}$ for drain-source voltages below threshold voltage $V_t$ compared to a single GaN/SiC switch.

This leads to higher switching losses and increased cross currents in hard switching half bridges.

In case of the bootstrap controlled circuit of FIG. 2, the input of $M_{GaN}$ is charged and discharged by the driver and no increase of the output capacitance occurs.

Device Reverse Operation

Device reverse operation is needed in most power conversion applications. It is the ability of a switch to act like a rectifying diode when turned off in order to conduct freewheeling currents.

Devices like a SiC JFET or a GaN HEMT usually have a Schottky gate contact instead of an isolated gate. When using these devices in a standard cascode configuration the Schottky gate contact hampers device reverse operation. When a current is flowing from source to drain through a cascode, a significant part of the current will flow through $M_{GaN}$ Schottky gate instead of completely flowing through the $M_{Si}$ body diode and the channel of $M_{GaN}$. Depending on the junction barrier heights of the $M_{GaN}$ gate contact and the $M_{Si}$ body diode the occurring gate current can reach destructive values. Hence, reverse operation of a standard cascode with a non-isolated gate of $M_{GaN}$ is not possible.

In case of the bootstrap controlled cascode circuit of FIG. 2, the bootstrap diode blocks the gate during reverse operation. The only drawback is a higher reverse operation voltage drop depending on the negative $M_{GaN}$ gate voltage.

Risk of Gate Isolation Breakdown

A viable option to enable reverse operation of a standard cascode is an isolated gate contact instead of a Schottky gate contact for the GaN/SiC device $M_{GaN}$. The isolation barrier prevents the cascode from high gate currents during reverse operation.

The limitation of using an isolation barrier is its breakdown voltage which is usually similar to MOSFET gate isolations with a breakdown voltage around 20V. Considering that the dynamic avalanche problem described above will be similar for a standard cascode with isolated gate contact, the gate isolation barrier will easily break due to high voltage peaks on node DM (high $M_{GaN}$ source-gate voltage).

The gate isolation barrier of $M_{GaN}$ will usually break before $M_{Si}$ reaches avalanche and limits the DM node voltage. This leads to an immediate damage of the cascode. When using the bootstrap controlled cascode circuit of FIG. 2, the DM node voltage peak can be limited to values far below gate isolation breakdown voltage.

The invention can be used in all power conversion applications in which normally-off switches are required, and enables the use of normally-on GaN or SiC insulated gate devices in such applications.

Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measured cannot be used to advantage. Any reference signs in the claims should not be construed as limiting the scope.

The invention claimed is:

1. A cascode transistor circuit comprising:
    a gallium nitride field effect transistor (FET) or a silicon carbide insulated gate field effect transistor (FET) having its drain connected to a high power rail;
    a silicon MOSFET with its drain connected to the source of the gallium nitride or silicon carbide FET and its source connected to a low power rail;
    a bootstrap capacitor connected between the gates of the gallium nitride or silicon carbide FET and the silicon MOSFET; and
    a diode with its anode connected to the gate of the gallium nitride or silicon carbide FET and its cathode connected to the low power rail, the diode being configured and arranged to permit the bootstrap capacitor to be changed during a period when the FET is switched on or active.

2. A cascode transistor circuit comprising:
    a gallium nitride field effect transistor (FET) or a silicon carbide insulated gate field effect transistor (FET) having its drain connected to a high power rail;
    a silicon MOSFET with its drain connected to the source of the gallium nitride or silicon carbide FET and its source connected to a low power rail;
    a bootstrap capacitor connected between the gates of the gallium nitride or silicon carbide FET and the silicon MOSFET; and
    a diode with its anode connected to the gate of the gallium nitride or silicon carbide FET and its cathode connected to the low power rail, wherein the diode comprises a Schottky diode which is integrated as part of an integrated circuit including the gallium nitride FET or silicon carbide FET.

3. A circuit as claimed in claim 1, wherein the diode comprises a discrete component.

4. A circuit as claimed in claim 1, wherein the gallium nitride or silicon carbide FET comprises a high electron mobility transistor.

5. A cascode transistor circuit comprising:
    a gallium nitride field effect transistor (FET) or a silicon carbide insulated gate field effect transistor (FET) having its drain connected to a high power rail;
    a silicon MOSFET with its drain connected to the source of the gallium nitride or silicon carbide FET and its source connected to a low power rail;
    a bootstrap capacitor connected between the gates of the gallium nitride or silicon carbide FET and the silicon MOSFET; and
a diode with its anode connected to the gate of the gallium nitride or silicon carbide FET and its cathode connected to the low power rail, wherein the bootstrap capacitor comprises a capacitor integrated on a circuit with the gallium nitride FET or silicon carbide FET or a circuit with the silicon MOSFET transistor.

6. A circuit as claimed in claim 1, wherein the bootstrap capacitor comprises a discrete capacitor.

7. A circuit as claimed in claim 1, wherein the silicon MOSFET comprises a trench MOS transistor.

8. A circuit as claimed in claim 1, wherein the capacitance of the bootstrap capacitor is least the same size as the input capacitance of the gallium nitride or silicon carbide FET.

9. A circuit arrangement comprising:
a cascode transistor circuit as claimed in claim 1; and
a gate driver circuit having a single gate output line and configured and arranged to provide active control of two power switches, respectively including the FET and MOSFET in the cascode transistor circuit.

10. A power supply comprising a circuit arrangement as claimed in claim 9.

11. A cascode transistor circuit comprising:
a gallium nitride field effect transistor (FET) or a silicon carbide insulated gate field effect transistor (FET) having its drain connected to a high power rail;
a silicon MOSFET with its drain connected to the source of the gallium nitride or silicon carbide FET and its source connected to a low power rail;
a bootstrap capacitor connected between the gates of the gallium nitride or silicon carbide FET and the silicon MOSFET; and
a diode with its anode connected to the gate of the gallium nitride or silicon carbide FET and its cathode connected to the low power rail, wherein the diode comprises a Schottky diode which is integrated on a circuit with the gallium nitride FET or silicon carbide FET.

12. The circuit as claimed in claim 11, wherein the diode comprises a discrete component.

13. The circuit as claimed in claim 11, wherein the gallium nitride or silicon carbide FET comprises a high electron mobility transistor.

14. The circuit as claimed in claim 11, wherein the bootstrap capacitor comprises a discrete capacitor.

15. The circuit as claimed in claim 11, wherein the silicon MOSFET comprises a trench MOS transistor.

16. The circuit as claimed in claim 11, wherein the capacitance of the bootstrap capacitor is least the same size as the input capacitance of the gallium nitride FET or silicon carbide FET.

17. A circuit arrangement comprising:
a cascode transistor circuit as claimed in claim 11; and
a gate driver circuit having a single gate output line and configured and arranged to provide active control of two power switches, respectively including the FET and MOSFET in the cascode transistor circuit.

18. The circuit as claimed in claim 11, further including a control circuit configured and arranged to allow active control of both the FET and MOSFET.

19. The circuit of claim 18, wherein the control circuit is a gate driver with a single output line configured and arranged to provide the active control.

* * * * *